United States Patent [19]

Davis

[11] 4,005,376
[45] Jan. 25, 1977

[54] ELECTRONICALLY VARIABLE SURFACE ACOUSTIC WAVE PHASE SHIFTER

[75] Inventor: Kenneth L. Davis, Alexandria, Va.

[73] Assignee: The United States of America as represented by the Secretary of the Navy, Washington, D.C.

[22] Filed: Apr. 15, 1976

[21] Appl. No.: 677,191

[52] U.S. Cl. .............................. 333/30 R; 310/8; 310/9.7; 357/23; 357/26

[51] Int. Cl.² ................. H03H 9/30; H01L 41/08; H01L 29/76

[58] Field of Search ................ 333/30 R, 72; 350/160 R, 161 R, 96 WG; 357/25, 23, 26, 61; 310/8, 8.1, 8.2, 8.3, 9.5, 9.7, 9.8; 330/5.5; 332/2, 3, 9 R, 26, 16 R

[56] References Cited

UNITED STATES PATENTS

| | | | |
|---|---|---|---|
| 3,633,996 | 1/1972 | Lean et al. | 350/161 W |
| 3,679,985 | 7/1972 | Fang et al. | 330/5.5 X |
| 3,827,002 | 7/1974 | Chao | 333/72 |
| 3,867,012 | 2/1975 | Phillips | 350/96 WG |
| 3,877,982 | 4/1975 | Coldren et al. | 357/26 X |
| 3,935,564 | 1/1976 | Quate et al. | 357/26 X |

Primary Examiner—Alfred E. Smith
Assistant Examiner—Marvin Nussbaum
Attorney, Agent, or Firm—R. S. Sciascia; Philip Schneider; Melvin L. Crane

[57] ABSTRACT

An electrically variable surface acoustic wave phase shifter including a substrate upon which a piezoelectric layer is deposited and separated therefrom by an insulating layer. An electrode is deposited on the piezoelectric layer and on the bottom of the substrate with an electrical dc bias applied onto the electrodes which causes a charge accumulation or a depletion region at the silicon surface. This charge accumulation or depletion region causes the boundary conditions to change therefore causing a phase change in an acoustical wave propagating along the layered silicon surface.

5 Claims, 1 Drawing Figure

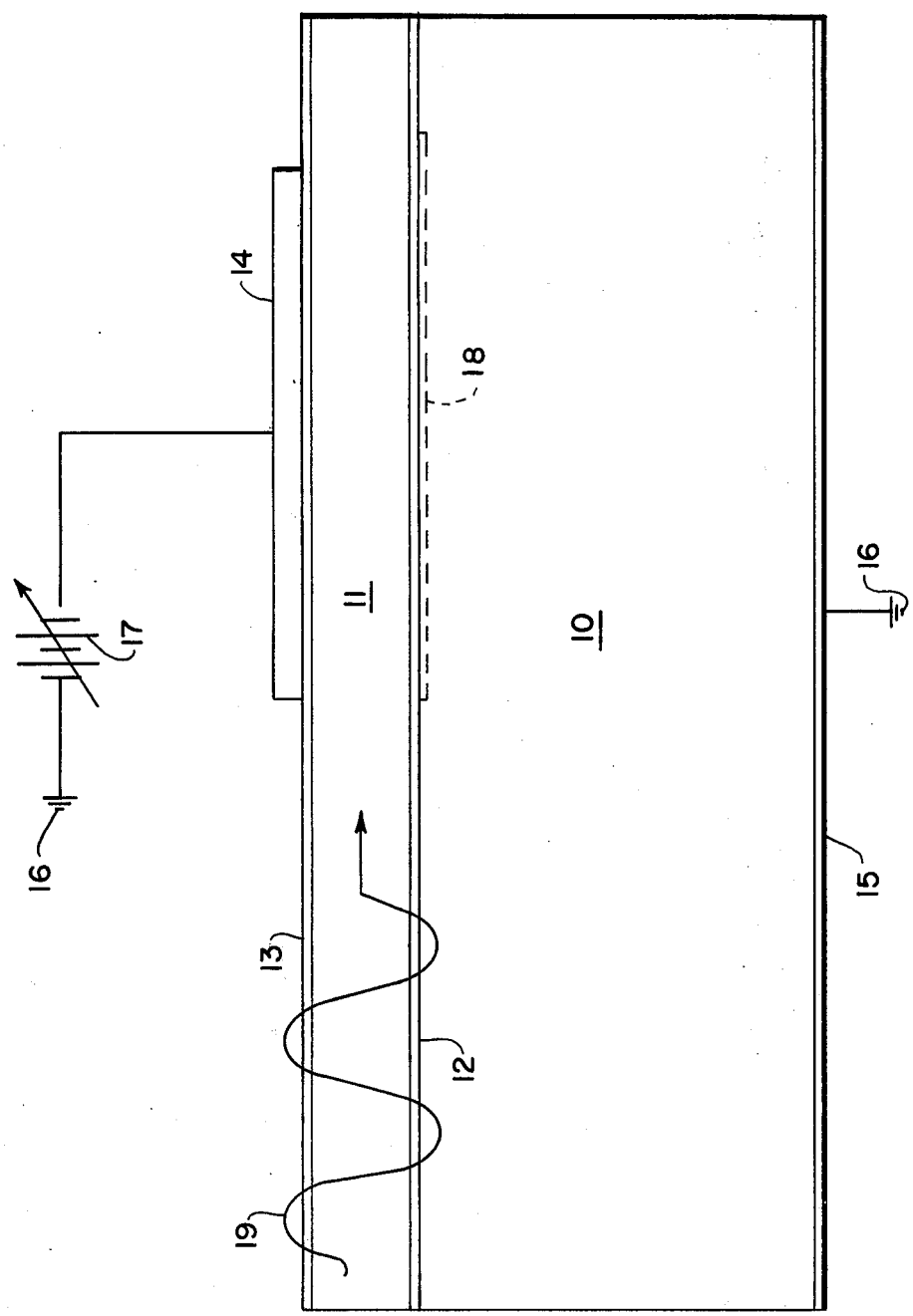

ELECTRONICALLY VARIABLE SURFACE ACOUSTIC WAVE PHASE SHIFTER

BACKGROUND OF THE INVENTION

This invention relates to surface acoustic waves and more particularly to a continuously variable, rapid, electrical control of the velocity of a propagating surface acoustic wave in a waveguide.

Heretofore surface acoustic wave phase shifters have been described in an article, "A Surface Wave Electronically Variable Phase Shifter" by J. A. Alusow, B. E. Burke, and E. Stern; in 1971 *IEEE Ultrasonics Symposium*, paper p-9. In the described device, the surface wave velocity depends on the spacing between a gold film and a lithium niobate delay line. Limitations of the device include mechanical stability, and slow response time since the variation is provided by a mechanical means. Further, the device requires close fabrication tolerances.

Another prior art system has been set forth in U.S. Pat. No. 3,827,002. In the patented device a difficulty arises in producing piezoelectric semiconductors with acceptable, uniform, semiconducting properties in the range required for phase shift applications; and a leaky current through the Schottky barrier heats the device creating unwanted thermal effects.

SUMMARY OF THE INVENTION

This device provides a means for changing the electrical boundary conditions along the path of a propagating surface acoustic wave, thus causing the wave velocity to change. This device is easily fabricated and mechanically stable. The device provides consistently high quality semiconducting properties, and the structural arrangement prevents undesirable thermal effects. As such, the device is capable of compensating for changes in surface wave velocity with temperature as well as compensating for doppler-shifted input signals in tapped delay line surface wave correlators, and is a phase shifter that can electrically tune the frequency of surface wave oscillators. Applications of the above makes this device a very useful device for integrating surface acoustic waves with existing semiconductor device technology.

BRIEF DESCRIPTION OF THE DRAWING

The drawing illustrates a side view of the device.

DETAILED DESCRIPTION

Now referring to the drawing, there is shown by illustration an electronically variable surface acoustic wave phase shifter made in accordance with the teaching of this invention. As shown, the device includes a semiconductor substrate 10 having a thickness of about 12 mils made of silicon or any other high quality semiconductor material. A piezoelectric layer 11 having a thickness of about 1.2 $\mu$ formed of zinc oxide or any other high quality piezoelectric layer is separated from the substrate by a thin insulating film 12 of silicon dioxide having a thickness of about 0.1 $\mu$. The insulating film protects the silicon substrate surface during deposition of the piezoelectric layer. A thin insulating film 13 having a thickness of about 0.1 $\mu$ is deposited onto the piezoelectric layer and may be of a material which is the same as the insulating film 12 between the piezoelectric layer and the substrate. An electrode 14 is deposited onto a portion of the thin insulating film 13 on the piezoelectric layer across the width thereof which prevents charge injection from the metal electrode 14 into the piezoelectric layer. The insulating film 13 can be omitted since the charge injection into the piezoelectric layer affects only the applied voltage operating point and not the phase shifting properties. An electrode 15 is deposited onto the entire bottom surface of the substrate in ohmic contact therewith and connected to ground 16. A variable dc voltage source 17 is connected with the electrode 14 and to ground to apply an appropriate dc bias to the electrode. By applying an appropriate dc bias to electrode 14, charge 18 can be made to accumulate at the silicon surface in the area beneath electrode 14, or a depletion region can be formed in the same region.

An acoustic surface wave 19 coupled into the above described structure will propagate along the piezoelectric layer with a velocity dependent upon the electrical and mechanical boundary conditions of the structure. However, by applying a dc bias on the electrode, a charge density accumulates along the upper silicon surface in the vicinity of the electrode. The charge density causes a variation in the boundary conditions imposed on the surface wave resulting in a change in the surface wave velocity. The electrically variable velocity change corresponds to an electrically variable phase shift in a surface acoustic wave delay line.

It has been determined that a bias voltage less than 20 volts will produce a phase shift up to 130°. The maximum phase shift possible for a given device depends upon the dimensions of the electrode, the resistivity of the substrate material, and the piezoelectric coupling of the piezoelectric layer.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. An electrically variable surface acoustic wave phase shifter which comprises:
   a substrate formed of a semiconductor material and having an upper and lower face;
   a bottom electrode covering the bottom face of said substrate;
   a thin film of electrically insulating material on the upper face of said substrate;
   a layer of piezoelectric material deposited onto said thin film of insulating material on said substrate;
   an upper electrode electrically connected with and covering a portion of said piezoelectric layer; and
   a variable voltage source for applying a dc bias connected between said upper electrode and said bottom electrode.

2. A phase shifter as claimed in claim 1 wherein: said semiconductor substrate is silicon.

3. A phase shifter as claimed in claim 2 wherein: said piezoelectric layer is formed by zinc oxide.

4. A phase shifter as claimed in claim 3 wherein: said insulating film between said piezoelectric layer and said substrate is silicon dioxide.

5. A phase shifter as claimed in claim 4 which includes:
   a thin layer of electrically insulating material on said piezoelectric layer separating said upper electrode from said piezoelectric layer.

* * * * *